United States Patent
Hynecek

(10) Patent No.: US 7,468,500 B2
(45) Date of Patent: Dec. 23, 2008

(54) HIGH PERFORMANCE CHARGE DETECTION AMPLIFIER FOR CCD IMAGE SENSORS

(75) Inventor: Jaroslav Hynecek, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 70 days.

(21) Appl. No.: 11/224,812

(22) Filed: Sep. 13, 2005

(65) Prior Publication Data

US 2007/0090273 A1 Apr. 26, 2007

(51) Int. Cl.
*H01L 27/00* (2006.01)

(52) U.S. Cl. .................. 250/208.1; 250/214 A; 330/277

(58) Field of Classification Search ......... 330/277; 250/208.1, 214 A
See application file for complete search history.

(56) References Cited

U.S. PATENT DOCUMENTS

| 4,649,430 | A | * | 3/1987 | Hynecek | 348/245 |
| 4,716,356 | A | * | 12/1987 | Vyne et al. | 323/312 |
| 5,192,920 | A | * | 3/1993 | Nelson et al. | 330/277 |
| 5,274,687 | A | * | 12/1993 | Hirama | 377/60 |
| 5,600,451 | A | * | 2/1997 | Maki | 358/483 |
| 5,872,484 | A | * | 2/1999 | Hynecek | 330/277 |
| 5,905,256 | A | * | 5/1999 | Nakano | 250/214 A |
| 6,153,453 | A | * | 11/2000 | Jimenez | 438/200 |
| 6,201,270 | B1 | * | 3/2001 | Chen | 257/292 |
| 6,288,613 | B1 | * | 9/2001 | Bennett | 330/296 |
| 2002/0008574 | A1 | * | 1/2002 | Mathe et al. | 330/10 |
| 2002/0088975 | A1 | * | 7/2002 | Furumiya | 257/59 |
| 2005/0285957 | A1 | * | 12/2005 | Mutoh et al. | 348/300 |

OTHER PUBLICATIONS

Albert J.P. Theuwissen, "Solid-State Imaging with Charge-Coupled Devices" Kluwer Academic Publishers, Boston 1995, pp. 76-79.
Jaroslav Hynecek, "Design and Performance of a Low-Noise Charge-Detection Amplifier for VPCCD Devices" IEEE Transactions on Electron Devices, vol. ED-31, No. 12, Dec. 1984, pp. 1713-1719.

* cited by examiner

*Primary Examiner*—Seung C Sohn
(74) *Attorney, Agent, or Firm*—Alan K. Stewart; W. James Brady; Frederick J. Telecky, Jr.

(57) ABSTRACT

The CCD charge detection amplifier includes a floating diffusion charge detection node biased from a voltage reference node; a reset device coupled between the floating Diffusion charge detection node and the voltage reference node; a first source follower stage having a control node coupled to the charge detection node; and a positive feedback device coupled in series with the source follower stage and having a control node biased from the voltage reference node.

11 Claims, 1 Drawing Sheet

HIGH PERFORMANCE CHARGE DETECTION AMPLIFIER FOR CCD IMAGE SENSORS

FIELD OF THE INVENTION

The present invention relates to solid-state image sensors and, specifically to CCD image sensor charge detection amplifiers with positive feedback in the first stage of the amplifier.

BACKGROUND OF THE INVENTION

A typical image sensor senses light by converting impinging photons into electrons that are integrated (collected) in sensor pixels. After completion of integration cycle, charge is usually transported, using the charge coupled device (CCD) process, into an on-chip analog memory and from the memory it is scanned into an output amplifier that is located adjacent to the pixel array. The signal from each pixel is processed in a serial fashion through the same amplifier, which results in high pixel-to-pixel uniformity, however the amplifier requires high speed. With increasing array size the pixel size, and consequently, the amount of signal in each pixel is reduced while the speed increases. This places more stringent demands on performance of the charge detection amplifiers that need to have higher sensitivity (conversion gain), lower noise, and operate at higher speeds. A typical charge detection amplifier consists of a floating diffusion that is reset by a reset transistor and that is connected to a gate of a Source Follower (SF) that is typically an NMOS transistor. More details about such circuits can be found for example in the book: Albert J. P. Theuwissen "Solid-State Imaging with Charge-Coupled Devices" Kluwer Academic Publishers, Boston 1995 pp.76-79, or in the article: J. Hynecek "Design and Performance of a Low-Noise Charge Detection Amplifier for VPCCD Devices", IEEE Transactions on Electron Devices, vol. ED-31, No. 12 Dec. 1984. When charge is transferred on the floating diffusion the transistor senses the resulting potential change and this change is then transferred either directly to the output terminals of the chip or to other on on-chip signal processing circuits. When the signal is transferred directly to the output terminals another buffer SF is usually necessary to increase the chip output driving power. For achieving a high conversion gain the first SF stage needs to be very small in order not to load the FD charge detection node by excessively large transistor gate input capacitance. The small transistor size also increases noise. On the other hand, for high frequency operation, it is necessary that the first SF stage has a reasonable size to drive the large input capacitance of the next stages with high speed. These are contradictory requirements that can be solved, for example, by using three SF stages. However, this solution results in an unacceptable loss of voltage signal and the resulting sensor charge conversion factor and thus overall sensor sensitivity.

SUMMARY OF THE INVENTION

It is an object of the present invention to overcome limitations in prior art. It is further object of the disclosed invention to provide a practical charge detection amplifier that has larger first transistor source follower stage size for high frequency operation and low noise without loading the floating diffusion node with large input capacitance. Incorporating another transistor connected in series with the first stage source follower transistor and biasing it from the second stage introduces a small positive feedback into the circuit, which accomplishes this goal and other objects of the invention.

DETAILED DESCRIPTION OF PREFERRED EMBODIMENTS

Figure 1:
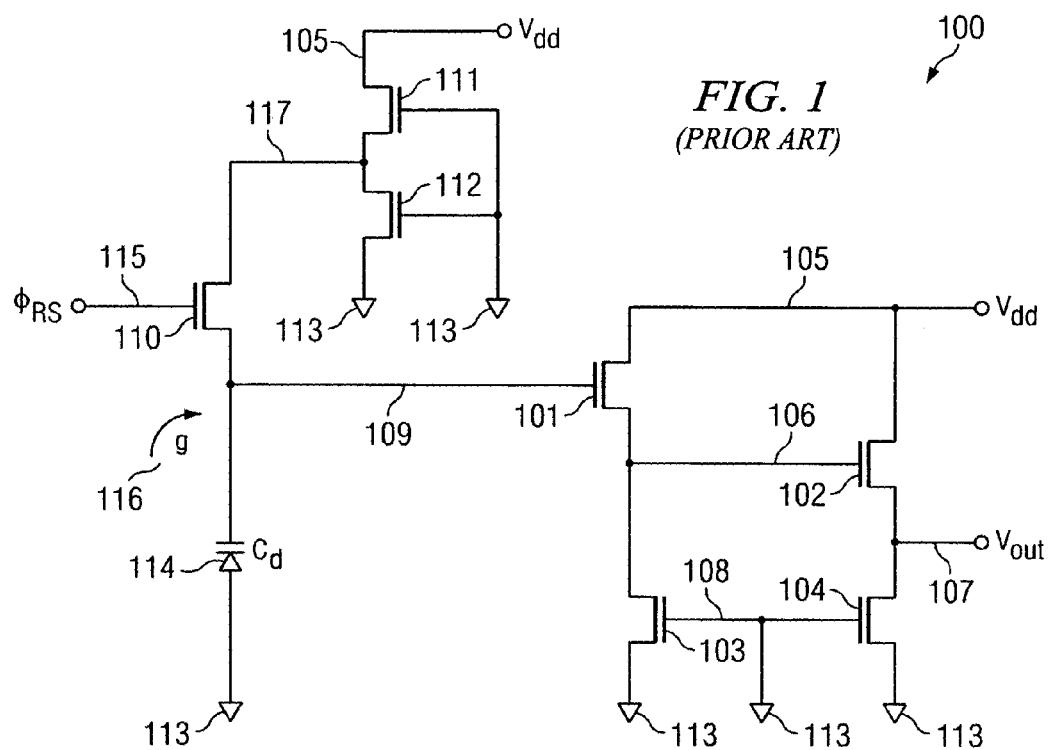
FIG.1 shows the simplified circuit diagram of a standard, prior art two-stage Source Follower charge detection amplifier.

In FIG.1 drawing 100 represents the simplified circuit diagram of the prior art charge detection amplifier used in many state of the art CCD image sensors. The buried channel (depletion mode) transistor 101 is connected as a first stage Source Follower (SF) with its gate connected to floating diffusion (FD) detection node 109, drain connected to drain bias node Vdd 105, and source connected to the first stage output node 106. The second SF stage is typically formed by surface channel (enhancement mode) transistor 102. The drain of 102 is connected to Vdd bias node 105, gate to node 106, and the source to output node Vout 107. Output node 107 can be the chip output bonding pad or input to other signal processing circuits such as an on-chip Analog to Digital Converter (ADC). Both the first and the second SF stages are biased by constant current sources 103 and 104 that are JFET transistors with gates 108 connected to ground reference terminal 113. Other types of transistors or more complex circuits can be used as current sources for biasing of SF stages. The FD charge detection node 109 is represented in the drawing by capacitor Cd 114. When detection node 109 receives charge 116 from CCD register (not shown in the drawing) its potential changes and this change is sensed by SF transistor 101. The detection node is reset by transistor 110 when a suitable reset signal pulse $\Phi_{rs}$, is applied to its gate 115. The voltage level to which the detection node is reset is supplied to the reset transistor via connection 117 and is generated by a reference generator formed by two JFET transistors 111 and 112 connected in series. The JFETs have different pinch off voltages, which results in the reference output that tracks the process variations. The drain of JFET 111 is connected to the common Vdd bias node 105. Similarly as for the SF bias current sources other circuits and other types of transistors can be used here for the design of voltage reference generators.

As mentioned previously, this circuit suffers from the lack of the high frequency response and has a low conversion gain. The low conversion gain is a result of the large capacitive loading of the FD charge detection node caused by the first SF stage transistor that has a large gate-source capacitance.

Figure 2:
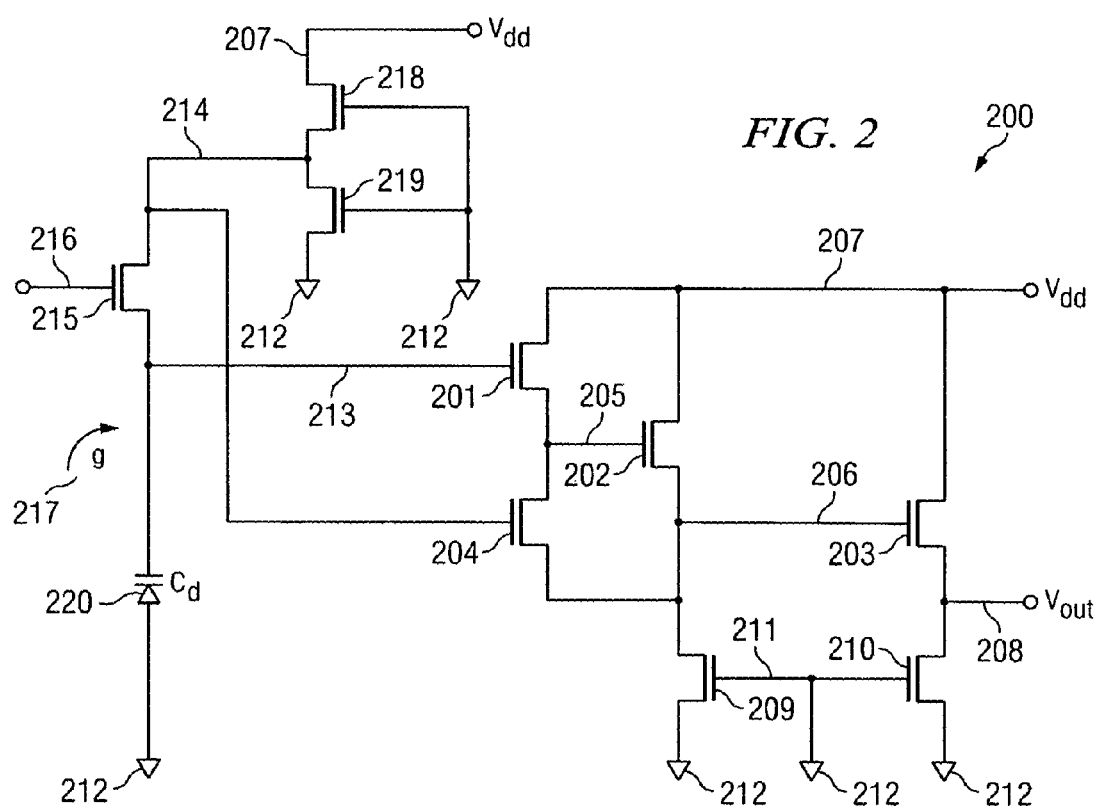
FIG.2 shows the simplified circuit diagram of the present invention that includes three-stage Source Follower charge detection amplifier with a positive feedback in the first Source Follower stage.

A preferred embodiment solution to these problems is presented in the circuit diagram 200 shown in FIG. 2. Transistor 201 is a buried channel transistor (depletion type), which is connected as a first SF with its gate connected to FD node 213, drain connected to Vdd terminal 207, and its source connected to first output node 205. The second SF stage transistor 202 is a surface channel transistor (enhancement type) with its gate connected to node 205, drain connected to Vdd bias terminal 207, and its source connected to second output node 206. The third SF stage transistor 203 is again a buried channel transistor (depletion type), which has its gate connected to node 206, drain to the common drain bias terminal Vdd 207, and its source connected to final output node Vout 208, which can be the chip output bonding pad. The novel and the key element of this circuit is buried channel transistor 204 that has its drain connected to node 205, source connected to node 206 and its gate connected to the output node 214 of the voltage reference generator. This transistor provides a small amount of positive feedback from node 206 to node 205 and through the source gate capacitance of the first SF stage transistor 201 directly to FD charge detection node 213. This provides the negative capacitance loading and increases the detection node conversion gain without increasing noise. The correct value of the negative capacitance can also compensate for other parasitic capacitances that are inevitably connected to the FD charge detection node and thus substantially reduce its effective capacitance. The bias for the SF transistors is provided by the JFET current sources 209 and 210 that have their gates 211 connected to ground reference terminal 212. Another type of transistors and more complex circuits can be used here in place of the JFETs to serve as current source biases. The FD detection node is represented in this drawing by capacitor Cd 220, similarly as in the prior art circuit diagram shown in FIG. 1. The FD receives charge 217 from the CCD register (not shown in the drawing) and is reset by transistor 215 when a suitable reset pulse $\Phi_{rs}$ is applied to its gate 216. The reference voltage generator consisting of two JFET transistors 219 and 218 that are connected in series generates the necessary reset voltage level, which is supplied to the reset transistor via connection 214. Another, more complex type of the reference voltage generator can also be used here that has the capability to track the process parameter changes or be temperature independent if required by the particular sensor application.

The described charge detection amplifier has therefore three SF stages, which provide the desired high frequency response. The high conversion gain is due to the small positive feedback that minimizes loading effect of the FD charge detection node without increasing noise.

The advantages of the present invention are provided by connecting another MOS transistor in series with the first SF stage. Biasing its source from the output node of the second stage introduces a small positive feedback into the circuit. As a result the first stage transistor input capacitance that normally undesirably loads the FD detection node changes from positive to negative value. This is due to the Miller feedback effect of the source-gate capacitance. This now reduces the detection node loading without increasing noise. As a result the first SF stage now has a small voltage gain, which makes it possible to use two or more SF stages for achieving high speed.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A charge coupled device charge detection amplifier comprising:
    a floating diffusion charge detection node biased from a voltage reference node;
    a reset device coupled between the floating diffusion charge detection node and the voltage reference node;
    a first source follower stage having a control node coupled to the charge detection node;
    a positive feedback device coupled in series with the first source follower stage and having a control node biased from the voltage reference node;
    a second source follower stage coupled to the first source follower stage; and
    wherein the positive feedback device is directly connected to an output node of the second source follower stage.

2. The device of claim 1 further comprising a third source follower stage coupled to the second source follower stage.

3. The device of claim 2 wherein the first, second, and third source follower stages are transistors.

4. The device of claim 2 wherein the third source follower stage is a buried-channel depletion-mode transistor.

5. The device of claim 1 further comprising a bias current generator for the first source follower stage.

6. The device of claim 5 wherein the bias current generator comprises a JFET transistor.

7. The device of claim 1 further comprising a voltage reference generator coupled to the voltage reference node.

8. The device of claim 1 wherein the first source follower stage is a buried-channel depletion-mode transistor.

9. The device of claim 1 wherein the second source follower stage is a surface-channel enhancement-mode transistor.

10. The device of claim 1 wherein the positive feedback device is a transistor.

11. The device of claim 1 wherein the reset device is a transistor having a control node coupled to a reset node.

* * * * *